United States Patent [19]

Yamazaki et al.

[11] Patent Number: 5,627,084
[45] Date of Patent: May 6, 1997

[54] METHOD FOR FABRICATING MIS SEMICONDUCTOR DEVICE

[75] Inventors: Shunpei Yamazaki, Tokyo; Yasuhiko Takemura, Kanagawa, both of Japan

[73] Assignee: Semiconductor Energy Laboratory Co., Ltd., Atsugi, Japan

[21] Appl. No.: 181,907

[22] Filed: Jan. 18, 1994

[30] Foreign Application Priority Data

Jan. 18, 1993 [JP] Japan ................................. 5-023287
Nov. 29, 1993 [JP] Japan ................................. 5-323117

[51] Int. Cl.$^6$ ................................................. H01L 21/336
[52] U.S. Cl. ........................................ 437/21; 437/411 FT
[58] Field of Search ............................ 437/21, 41, 101; 257/57, 66

[56] References Cited

U.S. PATENT DOCUMENTS 5,287,205 2/1994 Yamazaki et al. ........................ 359/57
5,289,030 2/1994 Yamazaki et al. ........................ 257/410
5,308,998 5/1994 Yamazaki et al. ........................ 257/57
5,403,762 4/1995 Takemura ................................ 437/41
5,508,209 4/1996 Zhang et al. ............................ 437/21
5,545,571 8/1996 Yamazaki et al. ........................ 437/21

FOREIGN PATENT DOCUMENTS 5-315329 11/1993 Japan .

Primary Examiner—Mary Wilczewski
Attorney, Agent, or Firm—Sixbey, Friedman, Leedom & Ferguson, P.C.; Gerald J. Ferguson, Jr.; Eric J. Robinson

[57] ABSTRACT

A MIS type semiconductor device and a method for fabricating the same characterized in that impurity regions are selectively formed on a semiconductor substrate or semiconductor thin film and are activated by radiating laser beams or a strong light equivalent thereto from above so that the laser beams or the equivalent strong light are radiated onto the impurity regions and on an boundary between the impurity region and an active region adjoining the impurity region.

14 Claims, 9 Drawing Sheets

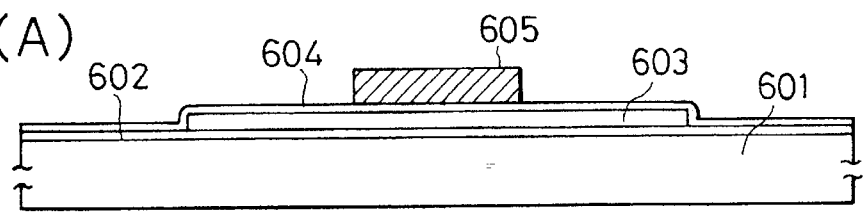
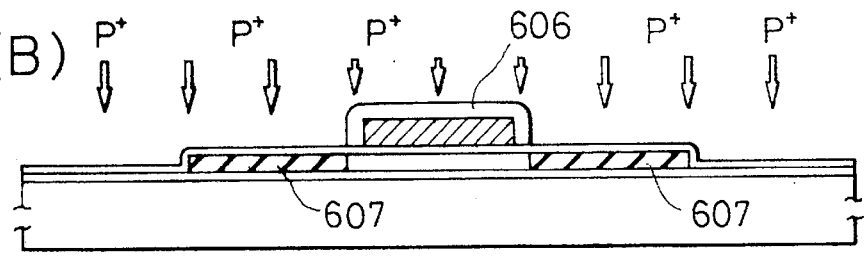
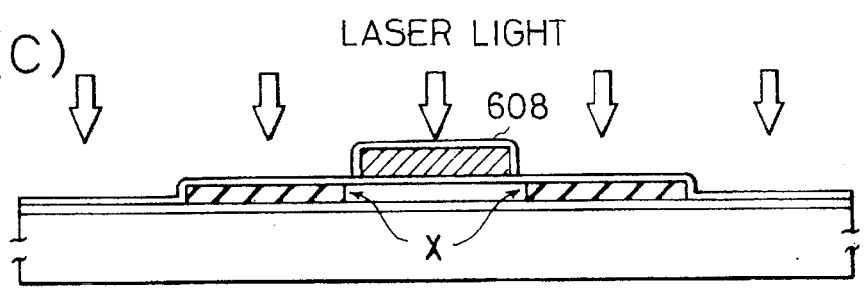
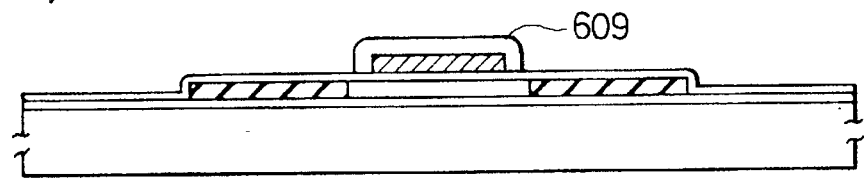
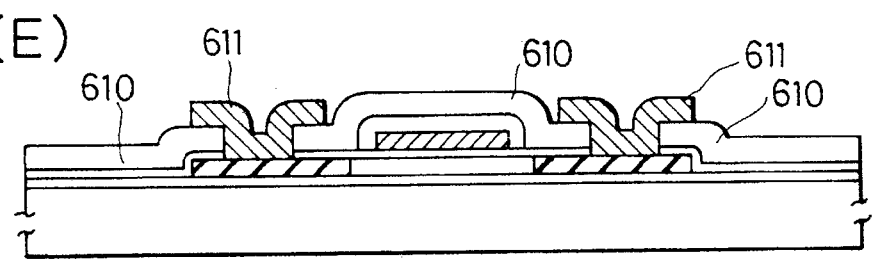

METHOD FOR FABRICATING MIS SEMICONDUCTOR DEVICE

BACKGROUND OF THE INVENTION

1. Field of the Invention

The present invention relates to a method for fabricating a metal insulator semiconductor type semiconductor device, i.e. a MIS type semiconductor device (also known as an insulated gate type semiconductor device). The MIS type semiconductor device includes, for example, a MOS transistor, thin film transistor and the like.

2. Description of the Related Art

Conventionally, a MIS type semiconductor device has been fabricated by using a self-aligning method. According to this method, a gate wiring (electrode) is formed on a semiconductor substrate or semiconductor coating film via a gate insulating film and impurities are injected into the semiconductor substrate or semiconductor coating film using the gate wiring as a mask. Such methods as a heat diffusion method, ion injection method, plasma doping method and laser doping method are used as means for injecting the impurities. Such means allow an edge of the gate electrode to substantially coincide with that of the impurity region (source and drain) and to eliminate an overlap state (a cause of parasitic capacity) in which the gate electrode overlaps the impurity region and an offset state (a cause of effective mobility degradation) in which the gate electrode is separated from the impurity region.

However, the conventional process has a problem in that spatial changes of carrier density in the impurity region and in an active region (a channel forming region) which adjoins with the impurity region and is located under the gate electrode are too large, so that a remarkably large electric field is created and in particular, a leak current (OFF current) increases when an inverse bias voltage is applied to the gate electrode.

The inventors of the present invention found that this problem could be alleviated by slightly offsetting the gate electrode and the impurity region. Then the inventors formed the gate electrode by an anodizable material in order to realize this offset state. As a result of the anodization, they found that a constant size offset state could be obtained with good reproducibility by injecting impurities using an anodized film produced as a mask.

Further, because the crystallinity of a semiconductor substrate or semiconductor coating film is damaged in parts where ions have penetrated in methods such as the ion injecting method and plasma doping method, by which impurities are injected by radiating high speed ions onto the semiconductor substrate or semiconductor coating film, improvement (activation) of the crystallinity is required. Although the crystallinity has been improved mainly thermally at a temperature of over 600° C. heretofore, a tendency towards a low temperature process has recently become apparent. Then the inventors also showed that activation can be implemented by emitting laser beams or strong light equivalent thereto, and that the massproducibility thereof is excellent.

FIG. 2 shows a process for fabricating a thin film transistor based on the aforementioned concept. Firstly, a ground insulating layer 202 is deposited on a substrate 201 and then an island crystalline semiconductor region 203 is formed. Then an insulating film 204 which functions as a gate insulating film is formed thereover. A gate wire 205 is then formed using an anodizable material (FIG. 2A).

Next, the gate wire is anodized and an anodic oxide 206 having a suitable thickness of less than 300 nm or preferably less than 250 nm for example is formed on the surface of the gate wire. Then using this anodic oxide as a mask, impurities (for example phosphorus (P)) are emitted in a self-aligning manner by means of ion injection or ion doping to form impurity regions 207 (FIG. 2B). After that, the regions into which the impurities have been injected are activated by radiating a strong light such as a laser beam thereon from above (FIG. 2C).

Finally, the thin film transistor is completed by depositing an interlayer insulator 208 and by creating contact holes on the impurity regions to create electrodes 209 to be connected to the impurity regions (FIG. 2D).

However, it was found that according to the method described above, the physical property at a boundary (indicated by X in FIG. 2C) between the impurity region and an active region (a semiconductor region sandwiched between the impurity regions directly under the gate electrode) is unstable and that problems could arise such as a leak current increasing over time and reliability decreasing. That is, as seen from the process, the crystallinity of the active region does not substantially change from the beginning. On the other hand, although the impurity region which adjoins the active region initially has the same crystallinity as the active region, its crystallinity is destroyed in the process of injecting a large quantity of impurities (up to $10^{15}$ $cm^{-2}$). It was then found that, although the impurity region is restored in the latter process of radiating laser beams, it is difficult to reproduce the same crystalline state as the original one and that the portion of the impurity region which contacts the active region in particular tends to be shaded during irradiation by laser beams and cannot be fully activated.

That is, the crystallinity of the impurity region and the active region is discontinuous and, due thereto, a trap level or the like tends to be produced. Especially when the method of radiating high speed ions is adopted as a method for injecting impurities, the impurity ions wrap around under the gate electrode section due to scattering and destroy the crystallinity of that portion. Then it is impossible to activate the region under the gate electrode section by laser beams or the like because it is shadowed by the gate electrode section.

One method for solving this problem is to activate that portion by radiating light such as a laser beam thereon from behind. This method fully activates the boundary between the active region and the impurity region because it is not shadowed by the gate wire. However, the substrate material must transmit the light in this case and, as a matter of course, this method cannot be employed when a silicon wafer or the like is used. Furthermore, because many glass substrates do not transmit ultraviolet light of less than 300 nm, a KrF excimer laser (wavelength: 248 nm), for example, which has excellent mass-producibility, cannot be utilized.

Accordingly, it is an object of the present invention to solve the aforementioned problems and to obtain a highly reliable MIS type semiconductor device such as a MOS transistor and thin film transistor by achieving continuity between the crystallinity of the active region and the impurity region.

SUMMARY OF THE INVENTION

According to the present invention, light energy is radiated not only onto an impurity region but also onto a part of an active region which adjoins it and especially onto a boundary portion between the impurity region and the active region, in which method the light energy generated from a laser or a strong light source such as a flash lamp is radiated onto the impurity region from above. In order to achieve such a goal, a part of the material composing a gate electrode section is removed before or after injecting impurities to render the boundary portion substantially transparent to radiated light.

The present invention comprises the steps of forming a gate wire (gate electrode) from an anodizable material after forming an insulating coating film which functions as a gate insulating film on a crystalline semiconductor substrate or semiconductor coating film, anodizing it to form an anodic oxide (a first anodic oxide) on the surface thereof, injecting impurities into the semiconductor substrate or semiconductor coating film in a self-aligning manner using the gate electrode section composed of the anodizable material and its anodic oxide or what is defined by the gate electrode section as a mask, and removing a part or all of the first anodic oxide before or after the step for injecting the impurities to allow light energy to be radiated onto a boundary between an impurity region and an active region or on the adjacent portion thereof to activate the impurity region.

Further, it goes without saying that, if necessary, the gate electrode can be anodized again in order to coat the surface thereof with an anodic oxide (a second anodic oxide) having a high insulating quality and an interlayer insulator or the like may be provided to lower a capacity coupling with an upper wire. It also goes without saying that although normally a wet method utilizing an electrolytic solution is used in the anodization, another known method of reduced pressure plasma (a dry method) may be used. Further, the anodic oxide obtained by the wet method may be a barrier type one which is minute and has a high withstanding voltage or a porous type one which is porous and has a low withstanding voltage. They may also be satisfactorily combined.

The anodizable materials preferably used in the present invention are aluminum, titanium, tantalum, silicon, tungsten and molybdenum. The gate electrode may be constructed by forming a single layer or multiple layer of a simple substance or alloy of those materials. It goes without saying that a small amount of other elements may be added to these materials. Furthermore, it need not be said that the wire may be oxidized by using a suitable method other than anodization.

As a source for the light energy used in the present invention, such excimer lasers as a KrF laser (wavelength: 248 nm), XeCl laser (308 nm), ArF laser (193 nm) and XeF laser (353 nm), such coherent light sources as a Nd:YAG laser (1064 nm) and its second, third and fourth high harmonics, carbon dioxide gas laser, argon ion laser and copper vapor laser and such incoherent light sources as a xenon flash lamp, krypton arc lamp and halogen lamp are suitable.

The MIS type semiconductor device obtained through such processes is characterized in that a junction of the impurity region (source, drain) and the gate electrode section (including the gate electrode and the anodic oxide accompanying it) have substantially the same shape (similar configuration) and that the gate electrode (which is bounded by a conductive plane; an associated substance such as the anodic oxide is not included) is offset from the impurity region.

There is no anodic oxide around the gate electrode when it has no oxide such as the second anodic oxide and the impurity region is offset from the gate electrode. The width of the offset is preferably 0.1 to 0.5 micron.

In the present invention, a capacitor comprising a first anodic oxide as an insulating material may be constructed by leaving a part of the first anodic oxide after forming it and by forming an upper wire so as to sandwich the remaining part. In this case, the thickness of an anodic oxide in the gate electrode section on a part which functions as an gate electrode of the MIS type semiconductor device and a thickness of an oxide of the capacitor section may differ, and each thickness can be determined in accordance with respective purposes.

Similarly, in a process for forming an oxide such as the second anodic oxide, the thickness of the anodic oxide may be altered even on the same substrate by adjusting an applied voltage per each wire, for example. The thickness of the oxide such as the anodic oxide on the gate electrode section and the thickness of the oxide on the capacitor (or on a portion where the wires cross) may be varied also in this case.

The above and other related objects and features of the present invention will be apparent from a reading of the following description of the disclosure illustrated in the accompanying drawings and the novelty thereof set forth in the appended claims.

BRIEF DESCRIPTION OF THE DRAWINGS

FIGS. 6(A) to 6(E) are sectional views for explaining a fourth embodiment of the present invention;

DETAILED DESCRIPTION OF PREFERRED EMBODIMENTS

[First Embodiment]

Figure 1A:
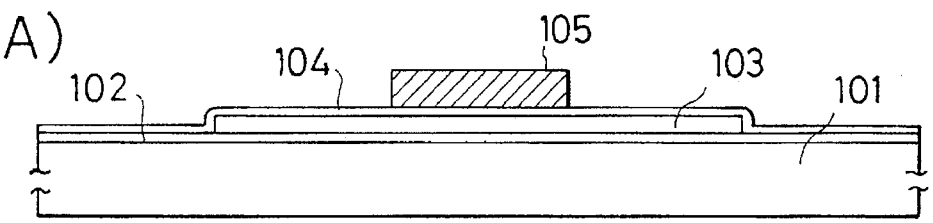
FIGS. 1(A) to 1(E) are sectional views for explaining a first embodiment of the present invention.

FIG. 1 shows a first preferred embodiment of the present invention. A thin film transistor is formed on an insulating substrate in this embodiment. The substrate 101 is a glass substrate, and a non-alkaline glass substrate such as Corning 7059 or a silica substrate, for example, may be used for the fabrication thereof. Taking costs into consideration, the Corning 7059 substrate was used here. A silicon oxide film 102 is deposited thereon as a ground oxide film. A sputtering method and a chemical vapor phase growing method (CVD method) may be used for depositing the silicon oxide film. The film was formed here by a plasma CVD method by using TEOS (tetraethoxisilane) and oxygen as material gases. The substrate temperature was 200° to 400° C. The thickness of the ground silicon oxide film was 500 to 2000 angstrom.

Next, an amorphous silicon film 103 was deposited and was patterned into a shape of island. A plasma CVD method and low pressure CVD method may be used for depositing the amorphous silicon film 103. Here the amorphous silicon film was deposited by the plasma CVD method using monosilane ($SiH_4$) as a material gas. A thickness of the amorphous silicon film 103 was 200 to 700 angstrom. Then laser beams (KrF laser, wavelength: 248 nm, pulse width: 20 nsec.) were irradiated on that. The substrate had been heated up to 300° to 550° C. for one to three hours in vacuum to release hydrogen contained in the amorphous silicon film before irradiation by the laser beams. The energy density of the laser beams was 250 to 450 $mJ/cm^2$. The substrate was heated up to 250° to 550° C. when the laser beams were radiated. As a result, the amorphous silicon film was crystallized and turned into a crystalline silicon film.

Next, a silicon oxide film 104 which functions as a gate insulating film was formed into a thickness of 800 to 1200 angstroms. Here the same method for fabricating the ground silicon oxide film 102 was adopted as a method for fabricating the silicon oxide film 104. Further, a gate electrode 105 was formed by using an anodizable material, i.e such metals as aluminum, tantalum and titanium, such semiconductors as silicon or such conductive metallic nitrides as tantalum nitride and titanium nitride. Here tantalum was used and its thickness was 2000 to 10000 angstroms (FIG. 1A).

Figure 1B:
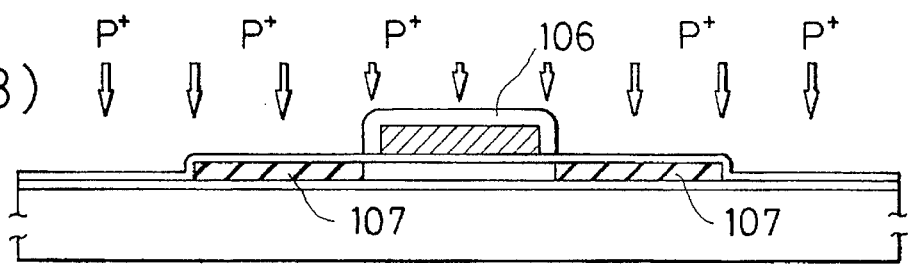

Thereafter, the gate electrode was anodized to form an anodic oxide (a first anodic oxide) 106 having a thickness of 1500 to 2500 angstroms on the surface thereof. Anodization was carried out by soaking the substrate in an ethylene glycol solution having 1 to 5% citric acid and by increasing the applied voltage by 1 to 5 V/min., integrating all gate wires to set them as a positive electrode and by setting platinum as a negative electrode. Then an impurity region 107 was formed by radiating ions of boron (B) or phosphorus (P) by means of a plasma doping method. While the acceleration energy of the ions is altered depending on the thickness of the gate insulating film 104, generally 50 to 65 keV of acceleration energy was suitable for boron and 60 to 80 keV was suitable for phosphorus when the thickness of the gate insulating film was 1000 angstroms. Further, while a suitable dose amount was $2\times10^{14}$ $cm^{-2}$ to $6\times10^{15}$ $cm^{-2}$, it was found that the lower the dose amount, the higher the reliability of the device obtained. As a result of the injection of the impurities carried out in the state in which the anodic oxide existed as described above, the gate electrode (tantalum) was offset from the impurity region. In addition, naturally the range of the impurity region shown in the figure is nominal and the ions actually wrap around due to scattering or the like (FIG. 1B).

Figure 1C:
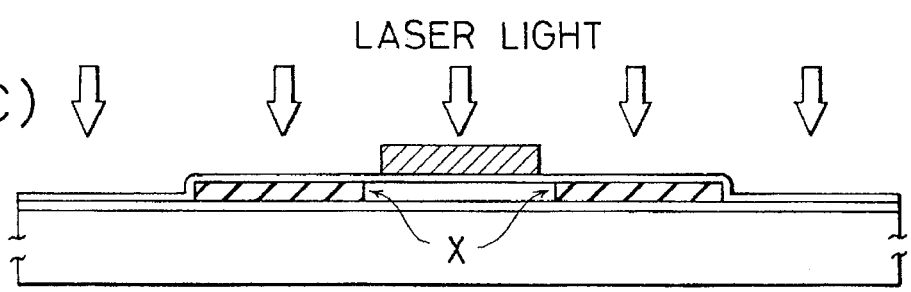

After finishing doping the impurities, only the first anodic oxide 106 was etched. Etching was carried out in a plasma atmosphere of tetrafluoride carbon ($CF_4$) and oxygen. The ratio (flow ratio) of tetrafluoride carbon ($CF_4$) to oxygen was $CF_4/O_2=3$ to 10. In this condition, although ditantalum pentoxide which is an anodic oxide of tantalum is etched, silicon oxide is not etched. Thereby, only the anodic oxide 106 could be etched without etching the gate wire 105 and the silicon oxide film 104 which is the gate insulating film. As a result, the respective boundaries (indicated by X) between the impurity region 107 and the active region sandwiched between the impurity regions appear as shown in FIG. 1C. Then the impurity regions were activated by irradiating them with laser beams in this state. The laser used was a KrF excimer laser (wavelength: 248 nm, pulse width: 20 nsec.) and the energy density thereof was 250 to 450 $mJ/cm^2$. The impurity region could be activated more effectively when the substrate was heated up to 250° to 550° C. during irradiation by the laser beams. Generally, a sheet resistance of 500 to 1000 ohm/sheet was obtained in the impurity region into which phosphorus was doped when the dose amount was $1\times10^{15}$ $cm^{-2}$, the substrate temperature was 250° C. and the laser energy was 300 $mJ/cm^2$.

Because the boundary (indicated by X) between the impurity region and the active region is irradiated by the laser beams in the present embodiment, the drop in reliability caused by degradation of the boundary portion which had been a problem in the conventional fabrication process is significantly decreased. In addition, because the laser beams are radiated onto the exposed gate wire in the present process, the surface of the wire preferably fully reflects the laser beams or the wire itself preferably has sufficient heat resistance. While there was no problem because the melting point of tantalum is more than 3000° C., one must be careful when a material having a low melting point such as aluminum is used, and it is desirable to provide a heat resistant material on the upper surface, for example (FIG. 1C).

Figure 1D:
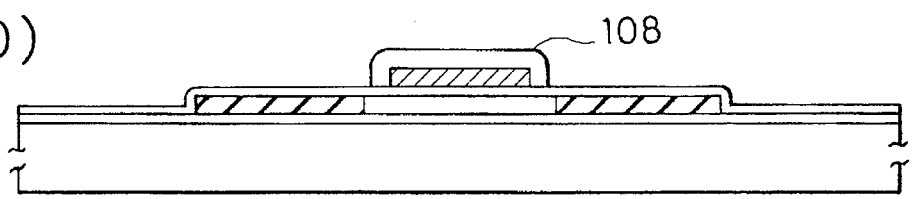

Thereafter, a current was supplied again to the gate wire to implement anodization to form an anodic oxide (a second anodic oxide) 108 having a thickness of 1000 to 2500 angstrom. Because this anodic oxide 108 determines the size of the offset of the thin film transistor due to a setback of a conductive face and prevents a short circuit with the upper wire, an adequate thickness needs to be selected for that purpose. Of course, such anodic oxide may not need to be formed according to circumstances (FIG. 1D).

Figure 1E:
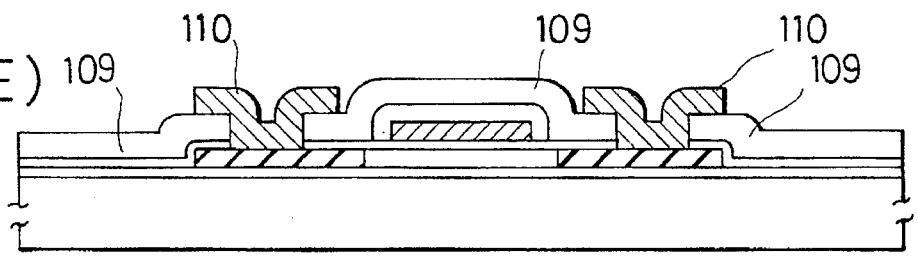
Figure 2A:
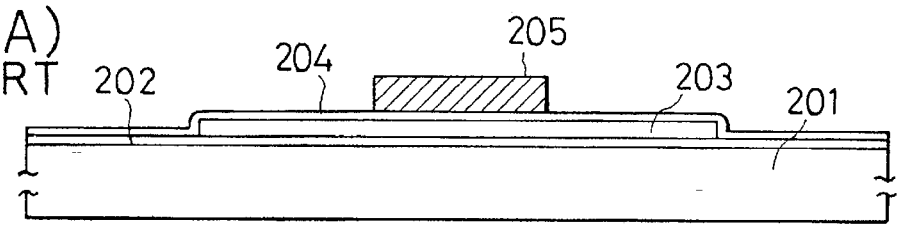
FIGS. 2(A) to 2(D) are sectional views for explaining a prior art example.
Figure 2B:
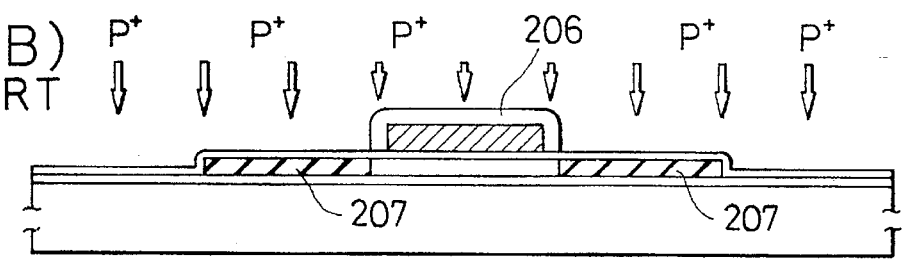
Figure 2C:
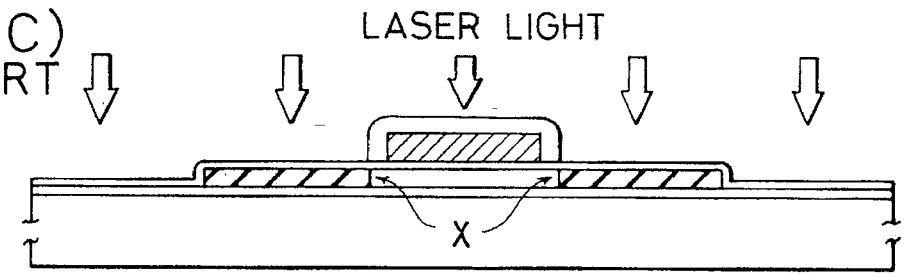
Figure 2D:
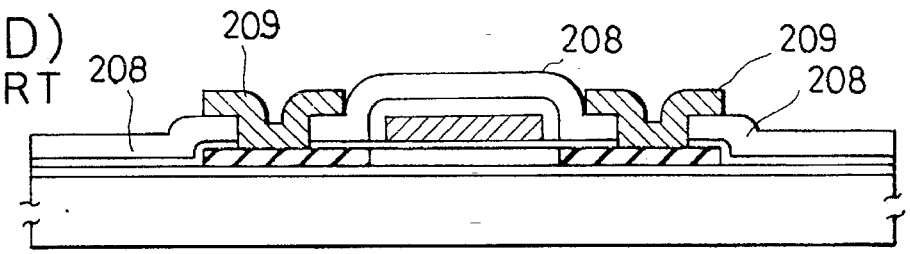

Finally, a silicon oxide film 109 was formed to a thickness of 2000 to 1000 angstroms as an interlayer insulator by means of a plasma CVD method using for example TEOS as a material gas. Then the thin film transistor was completed by creating contact holes thereon and by connecting electrodes 110 composed of a multi-layer film of titanium nitride 200 angstroms thick and aluminum 500 angstroms thick to the impurity region (FIG. 1E).

[Second Embodiment]

FIGS. 3 and 4 show a second embodiment. FIG. 3 is a section view taken along a dashed line in FIG. 4 (plan view). At first, a ground silicon oxide film was formed on a substrate (Corning 7059) 301 and an amorphous silicon film was formed to a thickness of 1000 to 1500 angstroms. Then the amorphous silicon film was crystallized by annealing at 600° C. for 24 to 48 hours in a nitrogen or argon atmosphere. A crystalline silicon island 302 was thus formed. Further, a silicon oxide film 303 which is 1000 angstroms thick and functions as a gate insulating film was deposited and tantalum wires (5000 angstroms thick) 304, 305 and 306 were formed (FIG. 3A).

Figure 3A:
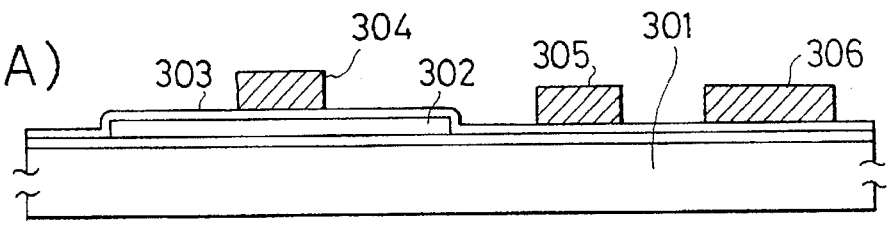
FIGS. 3(A) to 3(F) are sectional views for explaining a second embodiment of the present invention.
Figure 3B:
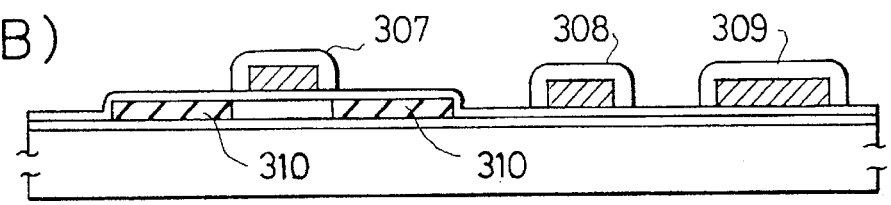
Figure 4A:
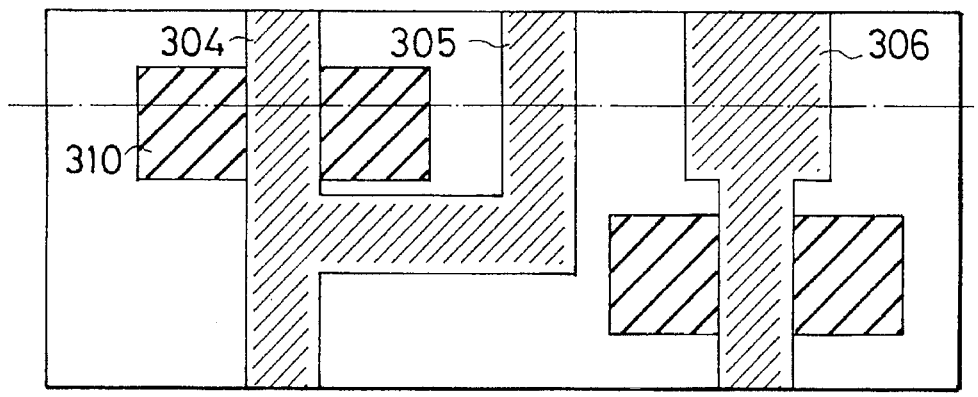
FIGS. 4(A) to 4(C) are plan views for explaining the second embodiment of the present invention.

Then a current was supplied to those wires 304 through 306 to form first anodic oxides 307, 308 and 309 having a thickness of 2000 to 2500 angstroms on the surface of those wires. Using those wires thus treated as a mask, impurities were injected into the silicon film 302 by means of a plasma doping method to form impurity regions 310 (FIGS. 3B and 4A).

Figure 3C:
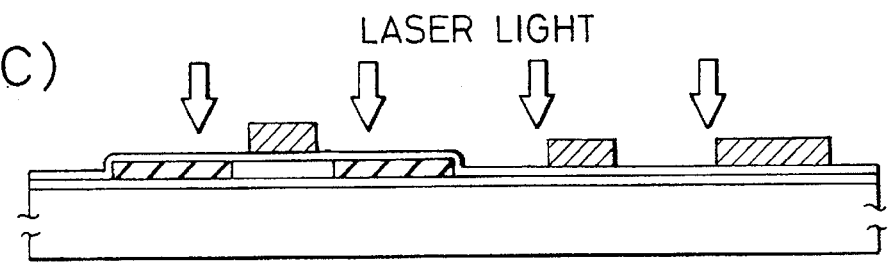

Then only the first anodic oxides 307, 308 and 309 were etched to expose the surface of the wires and KrF excimer laser beams were radiated in this state to activate the impurity regions (FIG. 3C).

Figure 3D:
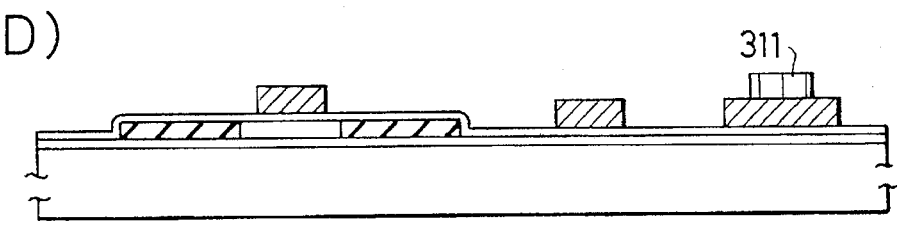
Figure 4B:
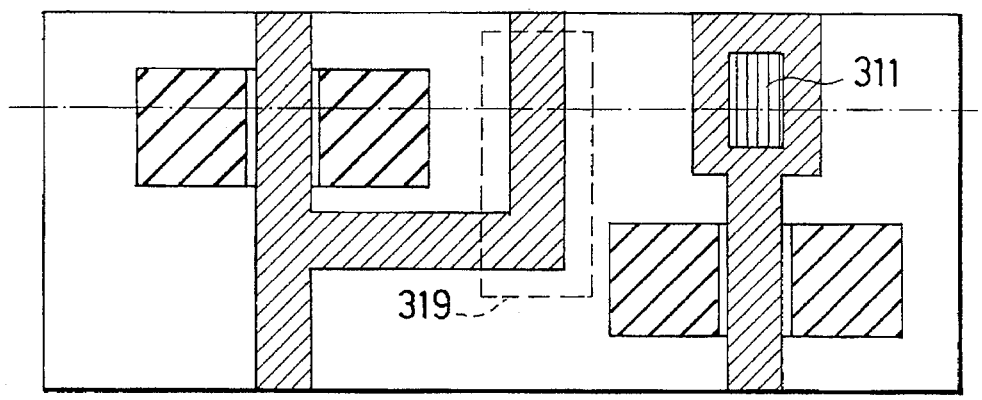

After that, a polyimide coating film 311 having a thickness of 1 to 5 microns was provided only on a portion where a contact hole was created on the wire 306. A photosensitive polyimide can be easily used due to its readiness in patterning (FIGS. 3D and 4B).

Figure 3E:
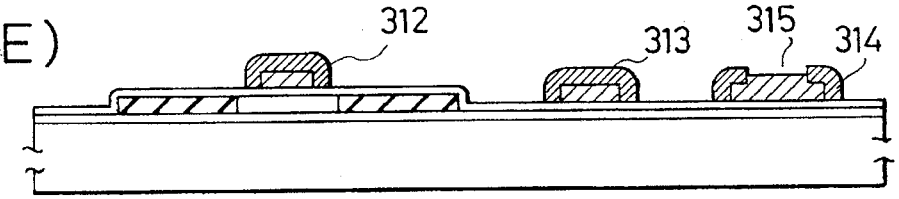

Then a current was supplied in the wires 304, 305 and 308 in this state to form second anodic oxides 312, 313 and 314 having thicknesses of 2000 to 2500 angstroms. The portion where the polyimide was previously provided is not anodized, thereby leaving a contact hole 315 (FIG. 3E).

Figure 3F:
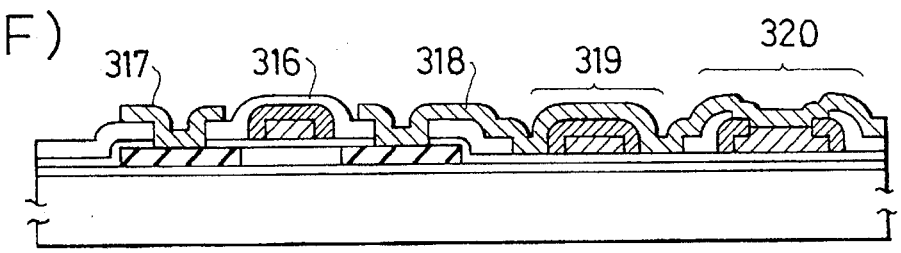
Figure 4C:
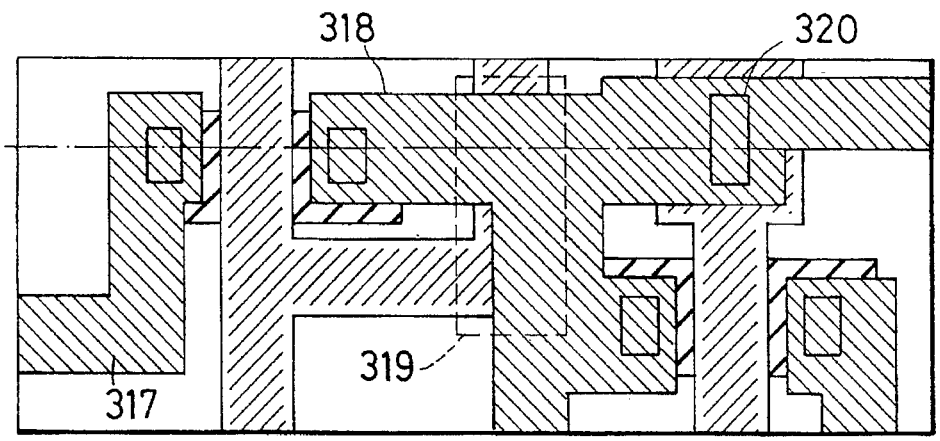

Finally, a silicon oxide film 316 having a thickness of 2000 to 5000 angstroms was deposited as an interlayer insulator and contact holes were created. Further, the second anodic oxide 313 was exposed by removing all the interlayer insulator on a portion of the wire 305 (a portion 319 surrounded by a dotted line in FIG. 4C). Then a wire and electrode 317 and 318 using a multilayer film of tantalum nitride (500 angstroms thick) and aluminum (3500 angstroms thick) was formed to complete the circuit. At this time, the wire 318 composed a capacitor with the wire 305 at the portion 319 and was connected with the wire 306 at a contact 320 (FIGS. 3F and 4C).

[Third Embodiment]

FIG. 5 shows a third embodiment. A ground silicon oxide film was formed on a substrate (Corning 7059) 501 and an amorphous silicon film was formed to a thickness of 1000 to 1500 angstroms. Then the amorphous silicon film was crystallized by annealing it at 600° C. for 24 to 48 hours in a nitrogen or argon atmosphere. A crystalline silicon island 502 was thus formed. Further, a silicon oxide film 503 which is 1000 angstroms thick and functions as a gate insulating film was deposited and tantalum wires (5000 angstroms thick) 504, 505 and 506 were formed (FIG. 5A).

Figure 5A:
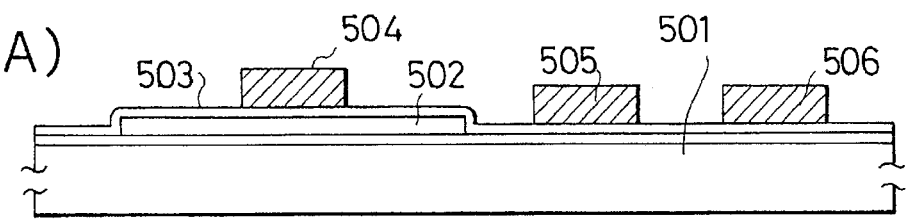
FIGS. 5(A) to 5(F) are sectional views for explaining a third embodiment of the present invention.
Figure 5B:
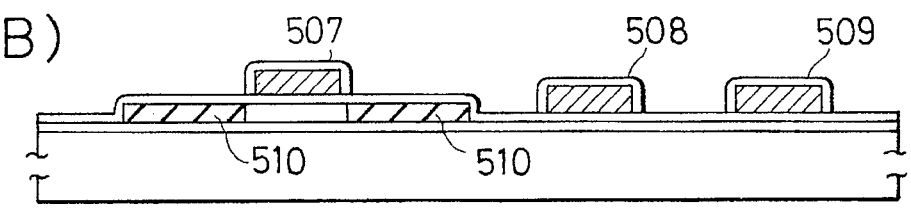

Then a current was circulated through those wires to form anodic oxide coating films 507, 508 and 509 having thicknesses of 500 to 1500 angstroms on the side and upper surfaces of those wires. Using those wires thus treated as a mask, impurities were injected into the silicon film 502 by means of a plasma doping method to form impurity regions 510 (FIG. 5B).

Figure 5C:
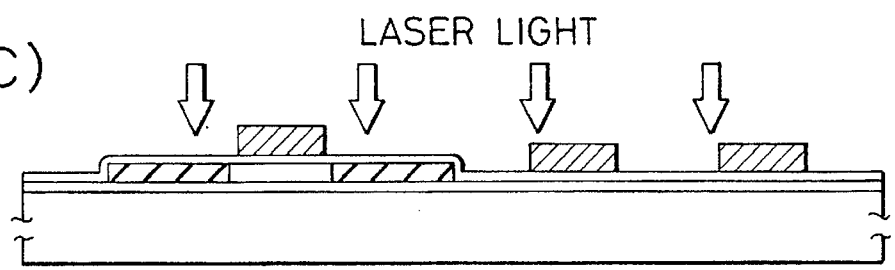

Then only the anodic oxides 507, 508 and 509 were etched to expose the boundary between the impurity region 510 and an active region sandwiched between the impurity regions and KrF excimer laser beams were radiated in this state to activate the impurity regions (FIG. 5C).

Figure 5D:
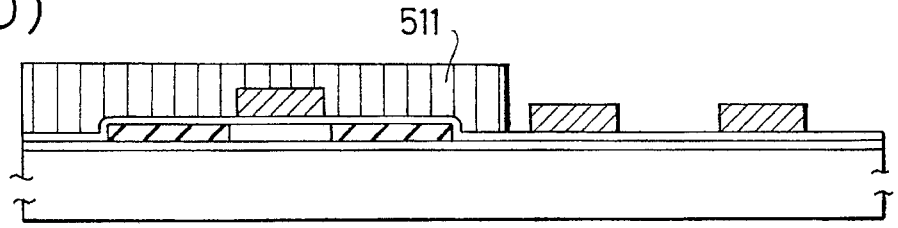

Thereafter, a polyimide coating film 511 having a thickness of 1 to 5 microns was provided to coat the wire 504. A photosensitive polyimide can be easily used due to its readiness in patterning (FIG. 5D).

Figure 5E:
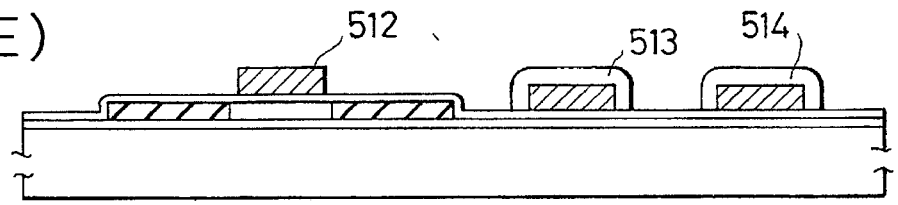

Then a current was circulated through the wires 504, 505 and 506 in this state to form anodic oxides 518 and 514 having thicknesses of 2000 to 2500 angstroms. The portion where the polyimide had been previously provided was not anodized (FIG. 5E).

Figure 5F:
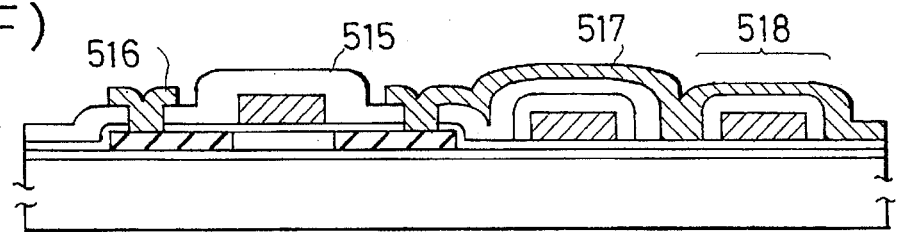

Finally, a silicon oxide film 515 having a thickness of 2000 to 5000 angstroms was deposited as an interlayer insulator and contact holes were created on the impurity regions 510. Further, the anodic oxide 514 was exposed by removing all the interlayer insulator on a portion of the wire 506. Then a wire and electrode 516 and 517 using a multilayer film of tantalum nitride (500 angstroms thick) and aluminum (3500 angstroms thick) were formed to complete the circuit. At this time, the wire 517 composed a capacitor with the wire 506 and anodic oxide 514 as a dielectrics at a portion 518 (FIG. 5F).

[Fourth Embodiment]

FIG. 6 shows a fourth preferred embodiment. In the present embodiment, a thin film transistor is formed on an insulating substrate. A silicon oxide film 602 was deposited on a substrate 601 as a ground oxide film. Next, an amorphous silicon film was deposited and patterned into the shape of island. Then laser beams (KrF laser, wavelength: 248 nm, pulse width: 20 nsec.) were radiated thereonto. The substrate was heated up to 300° to 550° C. for 0.1 to three hours in vacuum to release hydrogen contained in the amorphous silicon film before the irradiation by the laser beams. The energy density of the laser beam was 250 to 450 mJ/cm$^2$. The substrate was heated to 250° to 550° C. during irradiation by the laser beams. As a result, the amorphous silicon film was crystallized and turned into a crystalline silicon film 603.

Next, a silicon oxide film 604 which functions as a gate insulating film was formed to a thickness of 800 to 1200 angstroms. Further, a gate electrode 605 was formed by using aluminum. Its thickness was 2000 to 10000 angstroms (FIG. 6A).

After that, the gate electrode was anodized to form an anodic oxide (a first anodic oxide) 606 having a thickness of 1500 to 2500 angstroms on the surface thereof. The anodization was carried out by soaking the substrate in an ethylene glycol solution having 1 to 5% of tartaric acid and by increasing an applied voltage by 1 to 5 V/min. by integrating all gate wires to set them as a positive electrode and by setting platinum as a negative electrode. Then impurity regions 607 were formed by radiating ions of boron (B) or phosphorus (P) by means of a plasma doping method (FIG. 6B).

After completion of the doping of the impurities, only the first anodic oxide 606 was etched. The etching was carried out in a plasma atmosphere of tetrafluoride carbon ($CF_4$) and oxygen. The ratio (flow ratio) of tetrafluoride carbon ($CF_4$) to oxygen was $CF_4/O_2$=3 to 10. Under this condition, while the anodic oxide of aluminum is etched, silicon oxide is not etched. Thereby, only the anodic oxide 606 could be thus etched without etching the gate wire 605 and the silicon oxide film 604 which is the gate insulating film. The thickness of the anodic oxide was reduced by this etching process to 500 to 1500 angstroms (the anodic oxide 608).

As a result, the respective boundaries (indicated by X) between the impurity region 607 and the active region sandwiched between the impurity regions appeared as shown in FIG. 6C. Then the impurity regions were activated by emitting laser beams in this state. The laser used was a KrF excimer laser (wavelength: 248 nm, pulse width: 20 nsec.) and the energy density of the laser was 250 to 450 mJ/cm$^2$. The impurity regions could be activated more effectively when the substrate was heated up to 250° to 550° C. during emission of the laser beams. Because the boundary (indicated by X) between the impurity region and the active region is irradiated by the laser beams in the present embodiment, the drop in reliability caused by degradation of the boundary portion which had been a problem in the conventional fabrication process was significantly decreased (FIG. 6C).

Thereafter, a current was again supplied to the gate wire to anodize and to form an anodic oxide (a second anodic oxide) 609 having a thickness of 1000 to 2500 angstroms. Because the thickness of this anodic oxide 609 determines the size of the offset of the thin film transistor due to the setback of a conductive face during the anodization and prevents a short circuit with the upper wire, an adequate thickness may be selected for that purpose. Such anodic oxide may not need to be formed according to circumstances (FIG. 6D).

Finally, a silicon oxide film 610 was formed into a thickness of 2000 to 1000 angstroms as an interlayer insulator. Then the thin film transistor was completed by creating contact holes thereon and by connecting electrodes 611 composed of a multi-layer film of titanium nitride 200 angstroms thick and aluminum 500 angstroms thick to the impurity regions (FIG. 6E).

[Fifth Embodiment]

The present embodiment shows a case wherein two kinds of anodic oxides, i.e. porous and barrier type anodic oxides, are combined. That is, more than 0.2 microns or preferably more than 0.5 microns of the porous anodic oxide which is formed by a relatively low voltage is formed on the side of the gate electrode and meanwhile a barrier type anodic oxide having a good insulating quality is formed on the upper surface of the gate electrode.

The porous anodic oxide can be obtained by anodizing in an aqueous solution of 3 to 20% citric acid, oxalic acid, phosphoric acid, chromic acid or sulfuric acid. On the other hand, the barrier type anodic oxide can be obtained by anodizing using an organic solvent such as ethylene glycol solution of 3 to 10% tartaric acid, boric acid or nitric acid. The barrier type anodic oxide formed on the upper face of the gate electrode is preferably as thin as possible (so long as insulation from the upper wire is maintained), i.e. less than 0.2 micron or, even better, less than 0.1 micron.

Those two kinds of anodic oxides can be formed by forming a mask material on the upper face of the gate electrode to form the porous anodic oxide at first in this state and then by removing the mask material to form the barrier type anodic oxide centering on the upper face of the gate electrode. The mask material used for this purpose must be able to withstand the voltage for anodization, polyimide for example being suitable therefor. Especially when such a photosensitive material as Photonese (a photosensitive polyimide) and AZ 1350 is used, the gate electrode can be patterned using such mask material. Further, although a photoresist used in a normal photolithographic process (for example OFPR 800/30 cp manufactured by Tokyo Ohka Kogyo Co., Ltd.) has a disadvantage in that the resist gradually peels off during porous anodization because its insulating property is insufficient, this problem can be solved by forming an oxide coating film 50 to 1000 angstroms thick before applying the resist under the condition of barrier type anodization. FIG. 7 is a sectional view showing a fabrication process of the present embodiment. At first, a silicon oxide ground film 702 with a thickness of 2000 angstroms was formed on a substrate (Corning 7059) 701 by means of a sputtering method. Further, an intrinsic (I type) amorphous silicon film having a thickness of 200 to 1000 angstroms, or for example 500 angstroms thick, was deposited by plasma CVD. It was then patterned and etched to form an silicon island region 703. The silicon island region 703 was then crystallized by radiating laser beams (KrF excimer laser) thereon. Further, a silicon oxide film 704 having a thickness of 1000 angstroms was deposited as a gate insulating film by means of a sputtering method.

Figure 7A:
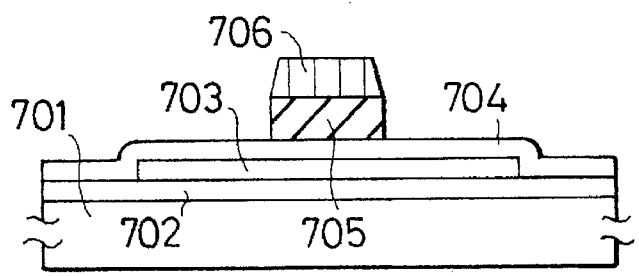
FIGS.7(A) to 7(F) are sectional views for explaining a fifth embodiment of the present invention.

Following that, an aluminum film (containing 0.1 to 0.3 wt % of scandium) having a thickness of 3000 to 8000 angstroms, or for example 4000 angstroms, was deposited by means of a sputtering method. Then a thin anodic oxide having a thickness of 100 to 400 angstroms was formed on the aluminum film by soaking the substrate in an ethylene glycol solution in which 3% tartaric acid was neutralized by ammonia to set its pH at about 7 and by applying 10 to 30 V of voltage. Then a photoresist (for example OFPR 800/30 cp manufactured by Tokyo Ohka Kogyo Co., Ltd.) having a thickness of about 1 micron was formed on the aluminum film thus treated by means of a spin coating method. Then a gate electrode 705 was formed by means of a known photolithographic method. A photoresist mask 706 is left on the gate electrode 705. The same effect can be obtained by using a photosensitive polyimide (Photonese) such as UR 3800 manufactured by Toray Industries, Inc., instead of photoresist (FIG. 7A).

Figure 7B:
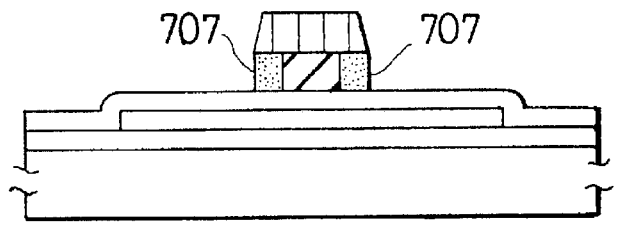

Next, a porous anodic oxide having a thickness of about 5000 angstroms could be formed on the sides of the gate electrode with a precision of less than ±1200 angstroms by soaking the substrate in a 10% citric acid solution and by anodizing for 10 to 500 minutes, or for example 200 minutes, by 5 to 50 V, or 8 V for example, of constant voltage. Because the mask material 706 existed on the upper face of the gate electrode, the anodization barely proceeded thereon (FIG. 7B).

Figure 7C:
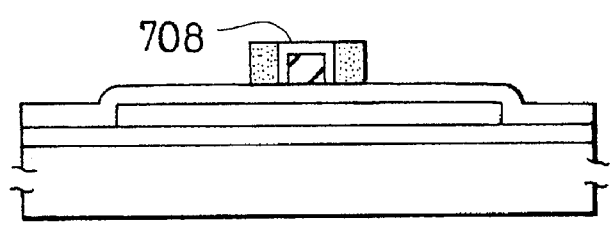

Next, another anodization was implemented by removing the mask material to expose the upper face of the gate electrode, by soaking the substrate in a 3% tartaric acid ethylene glycol solution (whose pH had been adjusted to be neutral by ammonia) and by circulating a current therethrough while increasing the voltage by 1 to 5 V per minute, or 4 V/min. for example, up to 100 V. At this time, not only the upper face of the gate electrode but also the sides of the gate electrode were anodized and a minute barrier type anodic oxide 708 was formed to a thickness of 1000 angstroms. The withstand voltage of the anodic oxide was more than 50 V (FIG. 7C).

Next, the silicon oxide film 704 was etched by means of a dry etching method. Either a plasma mode for isotropic etching or a reactive ion etching mode for anisotropic etching may be used in this etching. However, it is important not to deeply etch the silicon region 703 by fully increasing a selection ratio of silicon and silicon oxide. For example, when $CF_4$ is used as an etching gas, the anodic oxides 707 and 708 are not etched; only the silicon oxide film is etched. Further, the silicon oxide film under the anodic oxide is not etched and remains as a gate insulating film 710.

Figure 7D:
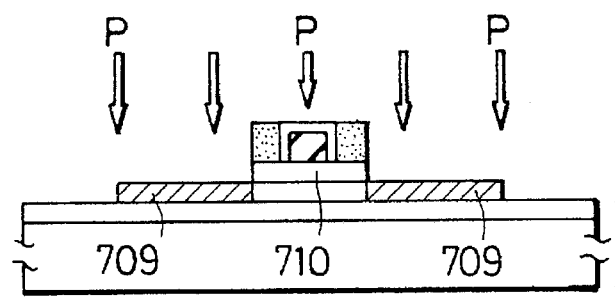

Then impurities (phosphorus) were injected into the silicon region 703 using the gate electrode 705 and the porous anodic oxide 707 on the sides as masks by means of a plasma doping method. Phosphine ($PH_3$) was used as a doping gas and the acceleration voltage was 5 to 30 kV, or 10 kV for example. The dose amount was $1 \times 10^{14}$ to $8 \times 10^{15}$ $cm^{-2}$, or $2 \times 10^{15}$ $cm^{-2}$ for example. As a result, N-type impurity regions 709 were formed (FIG. 7D).

Figure 7E:
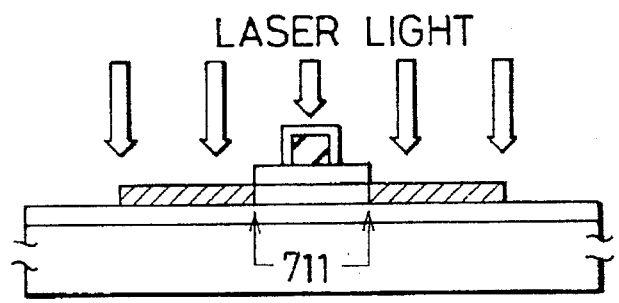

Next, the porous anodic oxide 707 was etched using a mixture of phosphoric acid, acetic acid and nitric acid to expose the barrier type anodic oxide 708. Then laser beams were radiated from above to implement laser annealing to activate the doped impurities. The laser beams were radiated onto the respective boundaries 711 between the doped impurity region and an undoped region during radiation (FIG. 7E).

The energy density of the laser beams was 100 to 400 $mJ/cm^2$, or 150 $mJ/cm^2$ for example, and 2 to 10 shots, or 2 shots for example, were radiated. The substrate may be heated up to 200° to 300° C., or for example to 250° C., during irradiation by the laser beams. The energy density of the laser beams was preferred to be slightly lower because the surface of the silicon region is exposed during irradiation in the present embodiment.

Figure 7F:
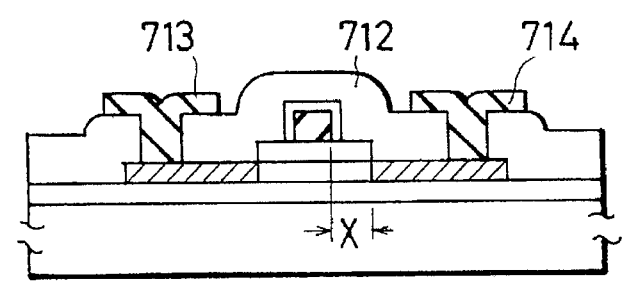

Then a silicon oxide film 712 having a thickness of 6000 angstroms was formed as an interlayer insulator by means of a plasma CVD method and contact holes were created thereon to form an electrode and wire 713 and 714 of source and drain regions of the TFT by a multi-layer film of metallic materials such as titanium nitride and aluminum. Finally, an annealing process was carried out at 350° C. for 30 minutes in one atmospheric pressure of a hydrogen atmosphere. The thin film transistor was completed by the process described above. In addition, an offset width x was about 6000 angstroms, i.e. the width of the porous anodic oxide 5000 angstroms plus the thickness of the barrier type anodic oxide 1000 angstroms (FIG. 7F).

Because no excessive voltage was applied to the gate insulating film during anodization, the interface level density of the gate insulating film was small and due to that, the sub-threshold characteristic (S value) of the TFT was very small. As a result, a sharp ON/OFF rising characteristic could be obtained.

[Sixth Embodiment]

FIG. 8 is a sectional view showing a fabrication process of the present embodiment. At first, a silicon oxide ground film 802 with a thickness of 2000 angstroms was formed on a substrate (Corning 7059) 801. Then, an intrinsic (I type) crystalline silicon island region 803 having a thickness of 200 to 1500 angstroms, or for example 800 angstroms, was formed. Then, coating the island silicon region, a silicon oxide film 804 having a thickness of 1000 angstroms was formed.

Figure 8A:
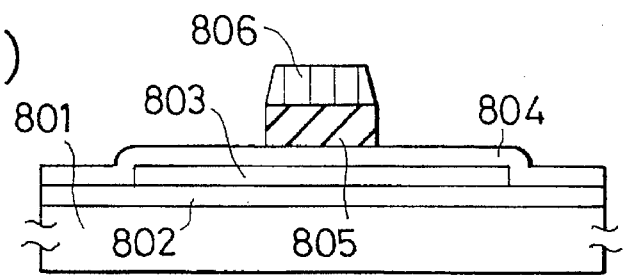
FIGS. 8(A) to 8(F) are sectional views for explaining a sixth embodiment of the present invention.

Following that, an aluminum film (containing 0.1 to 0.3 wt % of scandium) having a thickness of 3000 to 8000 angstroms, or for example 4000 angstroms, was deposited by means of a sputtering method. Then a thin anodic oxide having a thickness of 100 to 400 angstroms was formed on the aluminum film in the same manner as the fifth embodiment, a photoresist having a thickness of about 1 micron was formed on the aluminum thus treated by means of a spin coating method, a gate electrode 805 was formed by means of a known photolithographic method, and a photoresist mask 806 was left on the gate electrode (FIG. 8A).

Figure 8B:
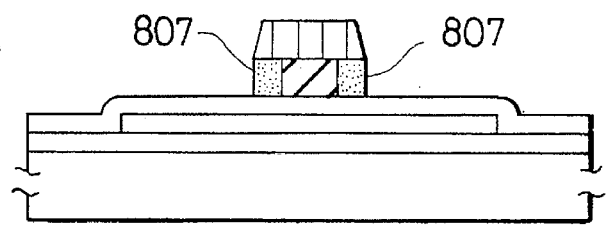

Next, a porous anodic oxide 807 having a thickness of about 5000 angstroms was formed on the sides of the gate electrode by soaking the substrate in a 10% oxalic acid solution and by anodizing for 10 to 500 minutes, or 200 minutes for example, by 5 to 50 V, or 8 V for example, of constant voltage. Because the mask material 806 existed on the upper face of the gate electrode, the anodization did not substantially proceeded thereon (FIG. 8B).

Next, anodization was implemented by removing the mask material to expose the upper face of the gate electrode, by soaking the substrate in a 3% tartaric acid ethylene glycol solution (whose pH had been adjusted to be neutral by ammonia) and by supplying a current therethrough while increasing the voltage by 1 to 5 V per minute, or 4 V/min. for example, up to 100 V. At this time, the upper face and the sides of the gate electrode were anodized and a minute barrier type anodic oxide 808 was formed to a thickness of 1000 angstroms. The withstand voltage of the anodic oxide was more than 50 V.

Figure 8C:
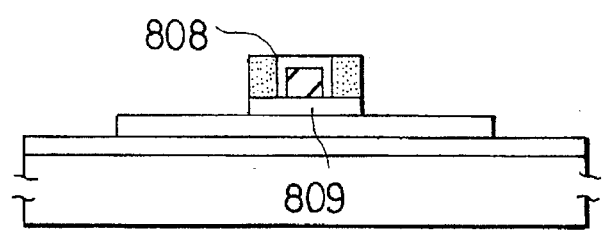

Next, the silicon oxide film 804 was etched by means of a dry etching method. While the anodic oxides 807 and 808 were not etched, only the silicon oxide film was etched in this etching. Further, the silicon oxide film under the anodic oxide was not etched and remained as a gate insulating film 809 (FIG. 8C). Next, the porous anodic oxide 807 was etched using a mixture of phosphoric acid, acetic acid and nitric acid to expose the barrier type anodic oxide 808. Then impurities (phosphorus) were injected into the silicon region 803 using the gate electrode 805 and the gate insulating film 809 defined by the porous anodic oxide 807 on the sides as masks by means of a plasma doping method. Phosphine ($PH_3$) was used as a doping gas and the acceleration voltage was 5 to 30 kV, or 10 kV for example. A dose amount was $1\times10^{14}$ to $8\times10^{15}$ cm$^{-2}$, or $2\times10^{15}$ cm$^{-2}$ for example.

Figure 8D:
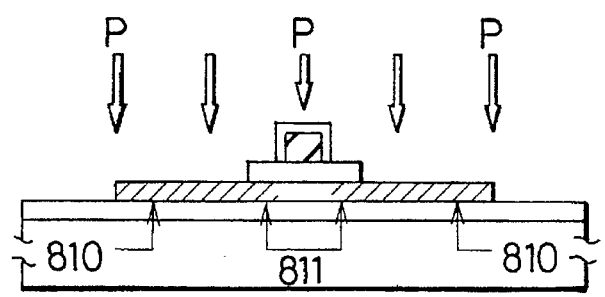

In this doping process, although high density phosphorus was injected into regions 810 which had not been coated by the gate insulating film 809, the doped amount was less and only 0.1 to 5% of impurities of the region 810 was injected into region 811 whose surface had been coated by the gate insulating film 809 by being blocked by the gate insulating film in the present embodiment. As a result, N-type high density impurity regions 810 and low density impurity regions 811 were formed (FIG. 8D).

Then laser beams were radiated from above to implement laser annealing to activate the doped impurities. In this case, however, enough laser beams could not be radiated to the respective boundaries between the low density impurity region 811 and an active region. However, because the amount doped to the low density impurity region 811 is very small as described above, damage to the silicon crystal is small and hence the need for improving the crystallinity by means of irradiation by laser beams is not so great.

Figure 8E:
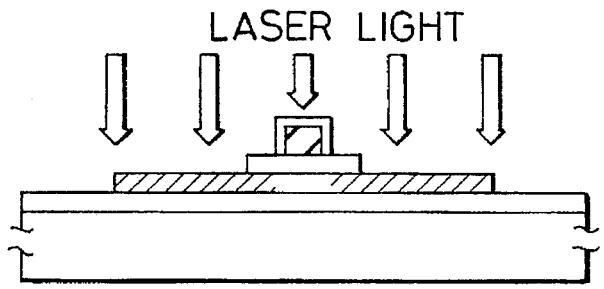
Figure 8F:
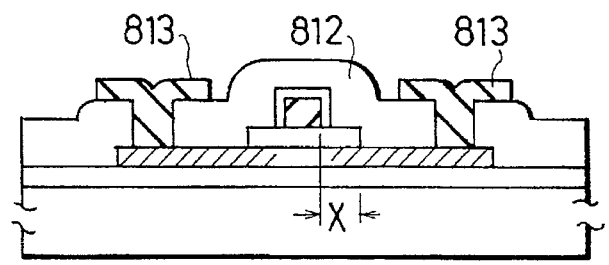

Conversely, the respective boundaries between the high density impurity region 810 and the low density impurity region 811 needs to be fully irradiated by laser beams. This is because crystal defects in the high density impurity region 811 are great because a large amount of impurity ions are injected into that region. The laser beams transmit also to the boundary portion as seen in the figure showing the structure of the present embodiment (FIG. 8E).

Then a silicon oxide film 812 having a thickness of 6000 angstroms was formed as an interlayer insulator by means of a plasma CVD method and contact holes were created thereon to form an electrode and wire 813 and 814 of source and drain regions of the TFT by a multi-layer film of metallic materials such as titanium nitride and aluminum. Finally, annealing was carried out at 350° C. for 30 minutes in one atmospheric pressure of hydrogen atmosphere. The thin film transistor was completed by the process described above.

The same structure with a so-called low density drain (LDD) structure could be obtained by the present embodiment. It has been shown that the LDD structure is effective in suppressing degradation by hot carriers, and the same effect could be obtained also in the TFT fabricated according to the present embodiment. However, compared to known processes for obtaining LDDs, the present embodiment is characterized in that the LDD can be obtained by a single doping process. Further, the present embodiment is characterized in that the high density impurity region 810 is defined by utilizing the gate insulating film 809 defined by the porous anodic oxide 807. That is, the impurity region is defined indirectly by the porous anodic oxide 807. Then, as is apparent in the present embodiment, a width x of the LDD region is determined substantially by a width of the porous anodic oxide.

Figure 9:
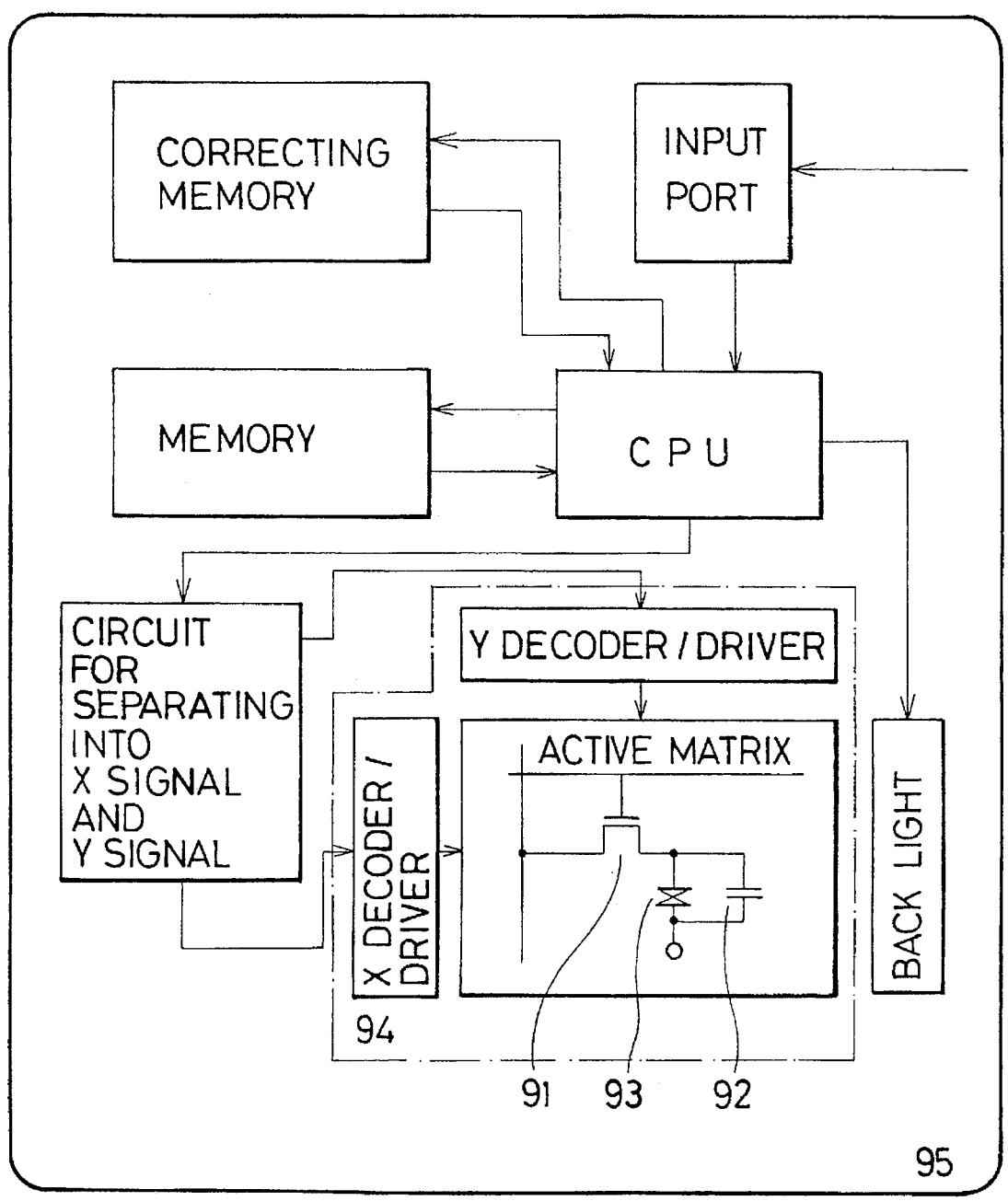
FIG. 9 is a block diagram of an integrated circuit utilizing the sixth embodiment.

The use of the method for fabricating TFTs shown in the present or previous embodiments allows implementation of a higher integration. And at that time, it is more convenient if the width x of the offset region or LDD region is changed in accordance to characteristics required for the TFT. FIG. 9 is a block diagram of an electro-optical system using an integrated circuit on which a display, CPU, memory and the like are mounted on one glass substrate.

Here an input port reads a signal input from the outside and converts it into an image signal. A correcting memory is a memory intrinsic to an active matrix panel for correcting input signals or the like corresponding to characteristics of the panel. This correcting memory holds information intrinsic to each picture element within its non-volatile memory and corrects item by item. That is, when there is a point defect in picture elements of an electro-optical device, the correcting memory sends a signal corrected corresponding to the picture elements around the point to those elements to cover the point defect, rendering the defect inconspicuous. Or, when a picture element is dark compared to the surrounding picture elements, it sends a larger signal to the picture element to give it the same brightness as the surrounding picture elements.

The CPU and memory are the same as those in normal computers. The memory has image memories which accommodate each picture element as a RAM. A back light for illuminating the substrate from the back may be modified in accordance to image information.

The width of an offset region or LDD region suited for each of those circuits can be obtained by forming 3 to 10 lines of wires to be able to modify anodizing conditions individually. Generally, in a TFT of the active matrix circuit (91), the width of the LDD region may be 0.4 to 1 micron, or 0.6 micron for example, when a channel length is 10 microns. In a N channel type TFT in a driver, when the channel length is 8 microns and the channel width is 200 microns, the width of the LDD region may be 0.2 to 0.3 micron, or 0.25 micron for example. Similarly in a P channel type TFT, when a channel length is 5 microns and a channel width 500 microns, the width of the LDD region may be 0 to 0.2 micron, or 0.1 micron for example. In a N channel type TFT in a decoder, when a channel length is 8 microns and a channel width is 10 microns, the width of the LDD region may be 0.3 to 0.4 micron, or 0.35 micron for example. Similarly in a P channel type TFT, when a channel length is 5 microns and a channel width is 10 microns, the width of the LDD region may be 0 to 0.2 micron, or 0.1 micron for example. Further, the width of the LDD region of NTFT and PTFT of the CPU, input port, correcting memory and memory in FIG. 9 may be optimized similarly to the decoder for low power consumption operating at high frequency. Thus the electro-optical device 94 could be formed on the same substrate having an insulating surface.

As described above, the present invention allows improvement in the reliability of MIS type semiconductor devices such as a MOS transistor, thin film transistor and the like fabricated in a low temperature process. Specifically, no great effect was exerted on characteristics of the transistor even when it was left for more than 10 hours in a state in which the source was grounded and more than +20 V or less than −20 V of potential was applied to one or both of the drain and/or gate.

Although the embodiments have been explained centering on the thin film transistor, it need not be said that the same effect as that of the present invention can be obtained in a MIS type semiconductor device fabricated on a monocrystal semiconductor substrate and for the semiconductor material, the same effect can be obtained by silicon-germanium alloy, silicon carbide, germanium, cadmium selenide, cadmium sulfide, gallium arsenide or the like, as well as the silicon described in the embodiments. As described above, the present invention is an invention beneficial to the industry.

While the present invention has been particularly shown and described with reference to preferred embodiments thereof, it will be understood by those skilled in the art that the foregoing and other changes in form and details can be made therein without departing from the spirit and scope of the present invention.

What is claimed is:

1. A method for fabricating a MIS semiconductor device comprising:
    a first step of forming a wiring comprising an anodizable material on an active region provided in a semiconductor with an insulating film between said wiring and said active region;
    a second step of anodizing the surface of said wiring, to form an anodic oxide;
    a third step of injecting an impurity into the semiconductor in a self-aligning manner using said wiring or a region defined by said wiring substantially as a mask after the anodization;
    a fourth step of removing the anodic oxide after the injecting step;
    a fifth step of improving a crystallinity of an impurity region in said semiconductor into which the impurity has been injected by rendering a boundary between said impurity region and said active region or a portion adjacent thereto substantially transparent to light to be radiated and by radiating said light from thereabove.

2. The method of claim 1 further comprising a step of anodizing said wiring again after the fifth step.

3. The method of claim 1 wherein a part or all of the second step is carried out in a reduced pressure plasma atmosphere.

4. The method of claim 1 wherein the said light is a laser light or a light having a light intensity equivalent to that of the laser light.

5. A method for fabricating a MIS semiconductor device comprising:
    forming a gate electrode comprising an anodizable material on a gate insulating film provided on an active region provided in a semiconductor;
    anodizing said gate electrode to form an anodic oxide on a surface of said gate electrode;
    injecting an impurity into said semiconductor in a self-aligning manner using said anodic oxide as a mask;
    removing said anodic oxide after said injecting step; and
    irradiating a light to an impurity region in said semiconductor into which said impurity is injected by said injecting step, and to a boundary between said impurity region and said active region with said gate electrode as a mask after said removing step to improve a crystallinity of said semiconductor of said boundary and said impurity region.

6. The method of claim 5 wherein said light is a laser light or a light having a light intensity equivalent to that of the laser light.

7. The method of claim 5 wherein said removing step is carried out by etching in a plasma atmosphere comprising $CF_4$ and $O_2$.

8. The method of claim 7 wherein ratio $CF_4/O_2$ is 3 to 10 in terms of flow rate.

9. The method of claim 5 wherein said gate electrode comprises a material having a melting point of 3000° C. or higher.

10. The method of claim 5 further comprising the step of anodizing said gate electrode after said irradiating step.

11. A method for fabricating a MIS semiconductor device comprising:
    forming a gate electrode comprising an anodizable material on a gate insulating film provided on an active region provided in a semiconductor;
    anodizing said gate electrode to form a first anodic oxide on a surface of said gate electrode;
    injecting an impurity into said semiconductor in a self-aligning manner using said first anodic oxide as a mask;
    removing said first anodic oxide after said injecting step;
    irradiating a light to an impurity region in said semiconductor into which said impurity is injected by said injecting step, and to a boundary between said impurity region and said active region with said gate electrode as a mask after said removing step to improve a crystallinity of said semiconductor of said boundary and said impurity region; and anodizing said gate electrode to form a second anodic oxide on the surface of said gate electrode after said irradiating step.

12. A method for fabricating a MIS semiconductor device comprising:

forming a gate electrode comprising an oxidizable material on a gate insulating film provided on an active region provided in a semiconductor;

oxidizing said gate electrode to form an oxide on a surface of said gate electrode;

injecting an impurity into said semiconductor in a self-aligning manner using said oxide as a mask;

removing said oxide after said injecting step; and irradiating a light to an impurity region in said semiconductor into which said impurity is injected by said injecting step, and to a boundary between said impurity region and said active region with said gate electrode as a mask after said removing step to improve a crystallinity of said semiconductor of said boundary and said impurity region.

13. A method for producing a semiconductor device comprising the steps of:

forming a first electrode wiring including an anodizable material on an insulating film provided on a semiconductor film having an active region and an impurity region;

anodizing the first electrode wiring to form a first anodic oxide on a surface of the first electrode wiring;

introducing an impurity into the semiconductor film using the first anodic oxide as a mask;

removing the first anodic oxide after the introducing step;

irradiating a light to the impurity region into which the impurity has been introduced and to a boundary between the impurity region and the active region using the first electrode wiring as a mask after the removing step, to improve a crystallinity of the impurity region and the boundary;

forming a covering film to cover the first electrode wiring;

anodizing at least one second electrode wiring other than the first electrode wiring to form a second anodic oxide on a surface of the second electrode wiring; and forming a third electrode wiring on the second anodic oxide.

14. A method for producing a semiconductor device comprising the steps of:

forming a gate electrode including an anodizable material on an insulating film provided on a semiconductor film having an active region and an impurity region;

anodizing the gate electrode to form an anodic oxide on a surface of the gate electrode;

introducing an impurity into the semiconductor film using the anodic oxide as a mask;

etching the anodic oxide to decrease a thickness of the anodic oxide after the introducing step; and irradiating a light to the impurity region into which the impurity is introduced and to a boundary between the impurity region and the active region using the gate electrode and the etched anodic oxide as masks after the removing step, to improve a crystallinity of the impurity region and the boundary.

* * * * *